United States Patent [19]

Storm

[11] 4,219,629
[45] Aug. 26, 1980

[54] P-OXYBENZOYL COPOLYESTERS COMPRISING THIODIPHENOL COMPONENTS AND HAVING IMPROVED FLEXIBILITY AND SOLUBILITY IN ORGANIC SOLVENTS

[75] Inventor: Roger S. Storm, Williamsville, N.Y.

[73] Assignee: Dart Industries Inc., Los Angeles, Calif.

[21] Appl. No.: 959,275

[22] Filed: Nov. 9, 1978

[51] Int. Cl.$^2$ .................. C08F 14/26; C08G 63/02; C08G 63/68; C08L 67/04
[52] U.S. Cl. .................................. 525/167; 428/421; 428/458; 428/463; 428/480; 528/193; 528/206; 528/226
[58] Field of Search ................. 528/206, 193; 525/167

[56] References Cited

U.S. PATENT DOCUMENTS

| | | | |
|---|---|---|---|
| 2,600,376 | 6/1952 | Caldwell | 528/209 |
| 2,728,747 | 12/1955 | Aelony et al. | 528/206 |
| 3,216,970 | 11/1965 | Conix | 528/176 |
| 3,240,735 | 3/1966 | Caldwell et al. | 260/26 |
| 3,310,601 | 3/1967 | De Acetis et al. | 525/483 |
| 3,600,350 | 8/1971 | Kwolek | 260/32.6 |
| 3,637,595 | 1/1972 | Cottis et al. | 528/193 |
| 3,640,965 | 2/1972 | Brode et al. | 528/74 |
| 3,644,593 | 2/1972 | Nowak et al. | 528/206 |
| 3,857,814 | 12/1974 | Economy et al. | 528/208 |
| 3,873,502 | 3/1975 | Hickner et al. | 528/109 |
| 3,884,990 | 5/1975 | Sakata et al. | 528/206 |
| 3,972,852 | 8/1976 | Inata et al. | 528/173 |
| 4,102,864 | 7/1978 | Deex et al. | 528/193 |

FOREIGN PATENT DOCUMENTS

907647 10/1962 United Kingdom ..................... 528/193

OTHER PUBLICATIONS

Chem. Absts. vol. 69:3336Z(1968).

*Primary Examiner*—Edward M. Woodberry
*Attorney, Agent, or Firm*—Paul R. Wylie; Bryant W. Brennan

[57] ABSTRACT

A p-oxybenzoyl copolyester which is flexible and soluble in organic solvents has recurring moieties of the formulas

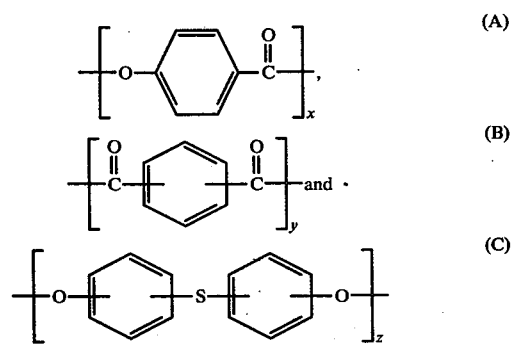

wherein the carbonyl groups of (B) are meta or para to each other and the oxygen atoms of (C) are meta or para to the sulfur atom thereof. Also described are organic solvent solutions of the p-oxybenzoyl copolyesters, molded articles made thereof and flexible coatings of such copolyesters on substrates.

24 Claims, 3 Drawing Figures

P-OXYBENZOYL COPOLYESTERS COMPRISING THIODIPHENOL COMPONENTS AND HAVING IMPROVED FLEXIBILITY AND SOLUBILITY IN ORGANIC SOLVENTS

Oxybenzoyl homopolyesters are described in U.S. Pat. Nos. 2,600,376 and 2,728,747 and in an article by Gilkey et al. entitled "Polyesters of Hydroxybenzoic Acids", published in Journal of Applied Polymer Science, Vol. II, No. 5, pp. 198–202, in 1959. In U.S. Pat. No. 3,637,595 there were described p-oxybenzoyl copolyesters made from (A) p-hydroxybenzoic acid, (B) terephthalic or isophthalic acid and (C) hydroquinone, resorcinol, p,p'-biphenol, p,p'-oxybiphenol or 4,4'-dihydroxydiphenyl sulfone. Such products, as mentioned in that patent, are more readily processable than the homopolyesters and are capable of being made into fibers and coatings. Still, despite the great improvements of the copolyesters of U.S. Pat. No. 3,637,595 over the p-oxybenzoyl homopolyesters previously known, they are insoluble or of low solubility in organic solvents and so are not normally useful in organic solvent solutions (which often might desirably be employed for coating substrates). Also, they are not as flexible as may often be desired for items to be made of such polymers.

The desired improved characteristics of increased solubility in organic solvents and increased flexibility of coatings and molded articles of p-oxybenzoyl copolyesters, together with many other desirable properties of such polymers, have been achieved by the present invention and are characteristic of the products thereof. In accordance with this invention a p-oxybenzoyl copolyester which is flexible and soluble in organic solvents comprises recurring moieties of the following formulas:

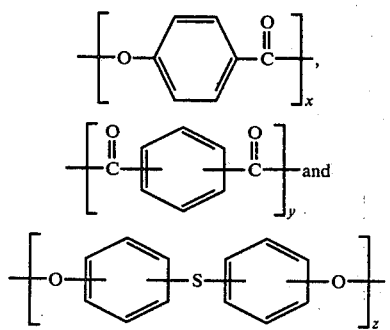

wherein x:y equals 0.1 to 10; x:z equals 0.1 to 10; y:z equals 0.9 to 1.1; x+y+z equals 20 to 600; the carbonyl groups of (B) are meta or para to each other; and the oxygen atoms of (C) are meta or para to the sulfur atom thereof. Also within this invention are molded articles, solutions and coatings made from the copolyesters and coatings made from mixtures of such copolyesters and other polymers, e.g., polytetrafluoroethylene.

The closest prior art to the described invention known to applicant is that reported by his attorney as the results of a search made in such attorney's files and in the classified files of the Patent and Trademark Office in subclasses 528-176; -179; and -193. Such prior art includes U.S. Pat. Nos. 3,216,970; 3,600,350; 3,637,595; 3,857,814; and 3,972,852; and British Pat. No. 907,647. U.S. Pat. Nos. 3,216,970, 3,637,595; 3,857,814 and 3,972,852 mention the use of reactants of structures somewhat like that of the thiodiphenol used to make the copolyesters of this invention but do not describe the use of such compound. Thus, in U.S. Pat. No. 3,216,970 there is described the manufacture of linear aromatic polyesters from isophthalic acid and 4,4'-dihydroxydiphenyl sulfone or di-p-hydroxybenzophenone. However, such copolyesters are not those of the present invention and do not include oxybenzoyl moieties from hydroxybenzoic acid or derivatives thereof. U.S. Pat. No. 3,637,595 teaches the making of copolyesters of p-oxybenzoyl, phthaloyl and dioxy aromatic moieties like those of the present invention except for the presence in the invented compounds of thiodiphenol residues which contribute advantageous flexibility and solubility characteristics to the product. U.S. Pat. No. 3,857,814 is directed to a branched aromatic polyester based on a cyanuryl nucleus with copolyester chains joined to the carbon atoms thereof. This patent is of interest because of its disclosure of dioxy moieties wherein a linkage atom between two phenoxies is oxygen or a linking group is CO or $SO_2$. U.S. Pat. No. 3,972,852 teaches the manufacture of polyesters from diphenols and included in the listing of diphenols are bis(4-hydroxyphenyl) sulfone and bis(4-hydroxyphenyl) ether. However, the utilization of hydroxybenzoic acid in the manufacture of the copolyester is not described and none of the diphenols is thiodiphenol. U.S. Pat. No. 3,600,350 and British Pat. No. 907,647 both disclose the manufacture of polymers wherein several atoms or groups connecting two phenyl radicals are described and both include sulfur as such an atom. The British patent relates to the manufacture of polyesters but they are not the copolyesters of this invention. None of the references indicates that the unexpectedly beneficial properties of the present copolyesters, improved flexibility and solubility in organic solvents could be obtained by utilization of thiodiphenol instead of the other dihydroxy reactants of U.S. Pat. No. 3,637,595 or similar patents.

Although p-hydroxybenzoic acid is a preferred starting material, derivatives which yield the desired oxybenzoyl moiety, such as esters and ethers thereof, may also be employed. Thus, the hydrogen of the hydroxy radical may be replaced by a suitable acidic residue, $R^1CO-$ wherein $R^1$ may be an aliphatic or an aromatic radical such as lower alkyl, e.g., methyl ("lower" meaning of 1 to 6 carbon atoms), phenyl or benzyl. Similarly, the hydrogen of the carboxylic acid portion of the p-hydroxybenzoic acid may be replaced by aromatic or aliphatic radicals, such as phenyl, benzyl or lower alkyl. Although it may often be desirable to utilize the phenyl ester of p-hydroxybenzoic acid and other esters and ethers, such as $C_6H_5OC_6H_4COOC_6H_5$, $CH_3OC_6H_4COOC_2H_5$, $C_6H_5OC_6H_4COOH$, $HOC_6H_4COOC_2H_5$, $C_6H_5CH_2OC_6H_4COOCH_2C_6H_5$, $C_6H_5OC_6H_4COOCH_3$, $C_2H_5COOC_6H_4COOH$, $(CH_3)_2CHCOOC_6H_4COOC_6H_5$, $C_6H_5COOC_6H_4COOC_6H_5$ and $CH_3COOC_6H_4COOCH_3$, in manufacturing the products of the present invention, it is often more preferred to employ the unesterified p-hydroxybenzoic acid or acetoxybenzoic acid.

The phthalic acid employed may be either terephthalic acid or isophthalic acid but instead of these there may also be substituted various esters thereof, such as diesters, either the same or mixed, and monoesters, with the esterifying materials being either aromatic or aliphatic. Preferred esterifying "alcohols" include phenol and lower alcohols such as ethanol, methanol, isopropanol and isobutanol but benzyl alcohol is also useful. Among the esters that are suitable there may be mentioned diphenyl terephthalate, diphenyl isophthalate, methylethyl terephthalate, diethylisophthalate and monoisobutylterephthalate (the half ester). Additionally, other lower aliphatic and aromatic alcohols may be employed, such as those of the formula $R^1OH$, with $R^1$ having the meaning given above.

Although it is preferred to employ 4,4'-thiodiphenol as the third reactant to form the present copolyesters 3,3'-thiodiphenol and 3,4'-thiodiphenol may also be employed, as may be monoesters and diesters of such compounds wherein the esterifying acid is an aromatic or aliphatic acid, preferably benzoic acid or lower aliphatic acid (of 1 to 6 carbon atoms per mol). When the carboxylic or hydroxyl groups of the reactant materials are partially or completely esterified the esterifying moieties may be the same or different. Exemplary of such compounds are the diesters of the mentioned three thiodiphenols with acetic acid, benzoic acid and isobutyric acid and the corresponding mixed diesters and monoesters.

Also within the invention are copolyesters wherein the aromatic (phenylene) groups of the polymer chain are substituted with one to three substituents which do not adversely affect (and usually do not materially alter) the physical and chemical characteristics of the copolyesters and do not interfere with the reactions. Examples of such substituents are lower alkyl, such as methyl; lower alkoxy, such as ethoxy; halogen, such as chlorine; and other suitable moieties.

The described reactants, which furnish moieties of formulas A, B and C for the syntheses of the present copolyesters, may be employed in any of a variety of ratios in the manufacture of such copolyesters but to achieve desired molecular weight (often high molecular weights), flexibility and solvent solubility of the products the molar ratios will usually be carefully controlled so as to be within certain ranges. Thus, x:y will often be within the range of 0.2 to 2 and preferably is from 0.4 to 1.5, e.g., 0.5 or 1 or about such ratios, and the molar ratio of x:z will also be in such range, although it may be different from that of x:y. The ratio of y:z will generally be in the range of 0.95 to 1.05, e.g., 1 or about 1 and when outside such range y preferably is no more than 10% different from z. Utilizing such ratios of reactants to obtain such ratios of components in the linear copolyester made, there may be produced products having molecular weights in the range of 500 to 72,000 or more but usually the molecular weights will be in the range of 3,000 to 30,000, preferably 3,500 to 25,000. Similarly, x will normally be from 2 to 100, preferably 3 to 80, y will be from 4 to 100, preferably 6 to 90; and z will be from 4 to 100, preferably 6 to 90; with the sum of x, y and z being from 20 to 200, preferably about 25 to 150.

Various forms of the copolyester of this invention and compositions and products made from them are illustrated in the accompanying drawing, in which.

Figure 1:
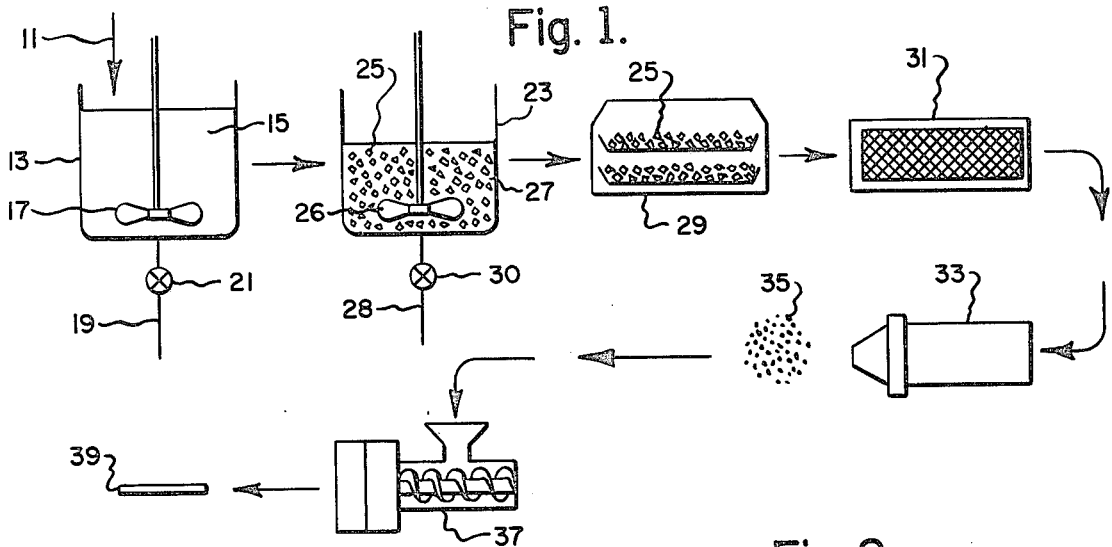
FIG. 1 is a schematic representation of the manufacture of a copolyester of this invention and conversion thereof to a molded article.

In FIG. 1 arrow 11 represents the addition to vessel 13 of acetic anhydride, high boiling solvent and reactants for making the present copolymer. Vessel 13 and the reaction mix 15 are kept at an elevated reaction temperature, while being stirred by stirring means 17, until sufficient copolymerization has been realized, after which the reaction mix, containing dissolved product, is cooled so as to precipitate out the copolyester. The solvent is removed through line 19 by opening valve 21 therein. The copolyester is transferred to vessel 23, wherein it is represented by numeral 25, and therein it is stirred by stirrer 26 while being extracted by a suitable extracting solvent 27 to remove any of the reaction solvent still on the particles of copolyester. After completion of extraction the extracting solvent is removed through line 28 by opening of valve 20. Product 25 is then dried in drier 29 and is advanced in $N_2$ at an elevated temperature in rotary oven 31, after which it is extruded at an elevated temperature in extruding mechanism 33 and, as a powdered product 35, is fed to injection molding mechanism 37, from which it is removed as an injection molded product 39, shown in test bar form. The results of "snapback" testing of the injection molded bar are given in Example 1, in which the described procedure of this figure is followed for the manufacture of such product and bar.

Figure 2:
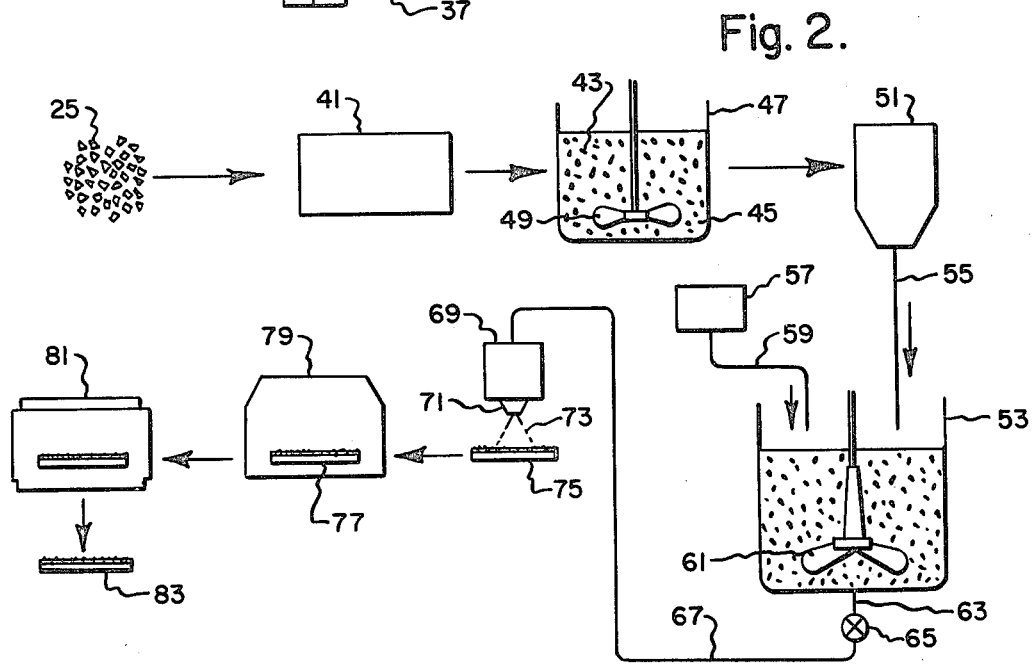
FIG. 2 is a diagrammatic representation of a copolyester of this invention being employed together with another resin to make a sintered coating for a metal substrate.

In FIG. 2 the resin 25 of Example 1 or a similar resin, having been extracted and dried but not $N_2$ advanced, is jet milled in apparatus 41, after which a dispersion of the particles 43 thereof in dispersing medium (water) 45 is made in tank 47, with the aid of stirrer 49. The resin dispersion is passed through colloid mill 51 and the resulting finely divided product in the dispersing medium is added to mixing tank 53 through line 55, together with another resin dispersion, such as an aqueous dispersion of polytetrafluoroethylene, from tank 57 through line 59. After completion of sufficient mixing with mixer 61 the dispersion is passed through line 63, valve 65 and line 67 to spraying means 69, from which it is sprayed through nozzle 71 as spray 73 onto the surface of a suitable substrate 75, usually of a metal such as aluminum, steel, copper or suitable iron alloy. The coated substrate 77 is then dried in dryer 79 and is sintered in sintering oven 81 to produce the final coated sheet 83. Such product and its properties are described in Example 2, wherein the procedure of FIG. 2 is followed.

Figure 3:
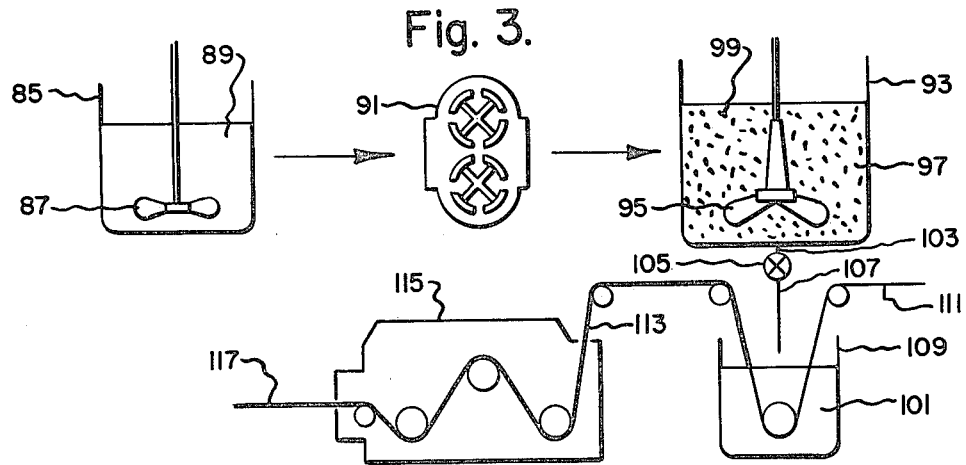
FIG. 3 is a diagrammatic representation of a copolyester of this invention being manufactured, dissolved in a suitable solvent and employed to coat a wire.

The manufacture of coated wire, shown in FIG. 3, begins with the making of a copolyester via the acetic anhydride route by the melt process. Mixing vessel 85, having stirrer 87 therein, is utilized for containing and mixing reaction mixture 89, which is raised to an elevated reaction temperature and held at such temperature until the desired extent of reaction has occurred, after which the melt is cooled to room temperature and the resulting resin is removed and pulverized in a pulverizing mechanism, such as hammer mill 91, from which it is transferred to mixing vessel 93, containing mixer 95 and solvent 97. The finely divided particles 99 of copolyester soon form a clear solution 101 in such tank and at that point the solution is transferred via lines 103 and 107, by the opening of valve 105, to coating tank 109, through which wire 111 is fed, usually several times, to produce the desired thickness of coating thereon. Coated wire 113 is dried and/or cured in oven 115 to produce the final coated product 117. Test results for such a product are given in Example 3, which follows the procedure described with respect to FIG. 3.

The copolyesters of this invention may be manufactured by methods which result in highly ordered or block copolymers but normally methods for making random copolymers or at least those which could result in the production of random copolymers are those employed. It has been found that methods in the art for synthesizing high molecular weight p-oxybenzoyl homopolyesters can be adapted to produce the copolyesters of this invention by utilizing the mixtures of the mentioned reactants in place of p-oxybenzoic acid or ester or other derivative thereof. Similarly the methods for making copolyesters like those of U.S. Pat. No. 3,637,595 may be modified by use of a thiodiphenol in place of an aromatic diol thereof. Note that with all the reactants, when derivatives are employed it is preferred to use the esters over the ethers. Normally, the compounds described, which can result in the moieties of formulas A, B and C, are simultaneously charged to a reaction zone but alternatively, the compound for producing the formula A moiety can be reacted with the compound yielding formula C and the reaction product thereof can be further reacted with a compound to yield a formula B moiety. Similarly and sometimes preferably, for the formation of copolyesters having regularly recurring structural units therein, a compound supplying the structural unit of formula A may be reacted with one supplying the unit of B and the reaction product thereof may be further reacted with a compound supplying the structure of formula C.

Normally reaction temperatures will be in the range of 200° to 400° C. preferably 300° to 370° C., e.g., 360° C. and preferably the condensation reactions will be carried out in a melt of the reactants (and reaction products) or in a solution or suspension of the reactants in a high boiling solvent, such as one having a boiling point or range in excess of 400° C. Such materials include a mixture of partially hydrogenated terphenyls (Therminol ® 66); other terphenyls; mixtures of various polychlorinated polyphenyls such as chlorinated biphenyls, typified by those available under the trademark Therminol FR; and a eutectic mixture of 73.5% of diphenyl oxide and 26.5% of diphenyl (Dowtherm ® A). When stepwise condensations of various reactants are employed one may utilize lower temperatures for some of the initial reactions. Thus, such reactions and reactions of p-hydroxybenzoic acid or other reactant supplying a moiety of formula A with a monoester of such p-hydroxybenzoic acid, phthalic acid and thiodiphenol may be carried out at a temperature in the range of about 50° to 220° C., preferably 160° to 200° C.

The polyesters of the present invention can be used for the preparation of fibers, films, coatings and molded articles. Because of their improved flexibility they are especially useful as molded items and as protective coatings. Their improved solubilities in organic solvents allows them to be more readily utilized as coating agents. They may also be combined with other polymeric materials to make products having the desirable characteristics of both. For example, when mixed with polytetrafluoroethylene, sometimes sold under the trademark Teflon ®, they form sintered and fused coatings which have excellent scratch resistance and toughness. The lower molecular weight materials made by the method of this invention may be further polymerized, for example, after being used in solution to coat a substrate, so as to increase rigidity (while still possessing snap-back properties).

In mixture with polytetrafluoroethylene (hereafter called PTFE) the proportion of copolyester to PTFE will be within the range of 1:10 to 1:1, preferably, 1:7 to 1:3, e.g., 1:4 to 1:5, so as to make a product of the most desired characteristics. While PTFE is the polymer of choice for such combination with the present copolyesters it is possible to use other perfluorinated addition polymers and these and the PTFE are usually such as to be stable to a temperature of at least 200° C., preferably at least 260° C. Such polymers are producible by addition polymerization of one or more unsaturated halogenated monomers, including tetrafluoroethylene, perfluoropropylene, chlorotrifluoroethylene and vinylidene fluoride. The most preferred of these are PTFE and a copolymer of tetrafluoroethylene and perfluoropropylene (available from E. I. DuPont de Nemours & Company as Teflon TL 120). Compositions containing the PTFE type perfluorinated polymers and oxybenzoyl copolyesters, like those of this invention but not based on thiodiphenol, are described in U.S. Pat. No. 3,644,593 and such patent and U.S. Pat. No. 3,637,595 are incorporated by reference herein for disclosures of reactants, products, processes, etc., therein which may be considered as relevant to the present invention.

With respect to solvents suitable for dissolving the present copolyesters so as to make them useful for coating applications those employed will be such as are capable of dissolving the copolyester to facilitate its application to a surface and will be vaporizable from such surface to leave a deposit of copolyester thereon. Such solvents, which are usually substantially nonpolar, include various lower alkyl substituted phenols, such as cresols and xylenols and corresponding compounds wherein ethyl and isopropyl groups are substituted for some or all of the methyl groups. Also useful, however, are benzene, toluene and xylene and other aromatic hydrocarbons and substituted hydrocarbons especially in mixtures with one or more alkyl phenols, such as in mixture with o-cresol. Although the aromatic hydroxyl-containing solvents are preferred, aliphatic solvents, such as hydrocarbons of chain lengths from 6 to 15 carbon atoms, may also be employed where suitable, often in comparatively minor proportions with one or more of the aromatic solvents. Similarly, corresponding aliphatic and aromatic ethers, esters and ketones and chlorinated hydrocarbons and other compounds may be useful, as may be the various isomers and isomer mixtures of the mentioned solvents.

The following examples further illustrate the invention but are not to be considered as limiting it. Unless otherwise mentioned all temperatures are in °C. and all parts are by weight.

EXAMPLE 1

A linear copolyester containing equimolar ratios of p-oxybenzoyl, terephthaloyl and thiodiphenoxy moieties is prepared by copolymerization of equimolar proportions of p-hydroxybenzoic acid, terephthalic acid, and 4,4'-thiodiphenol. Polymerization is via the acetic anhydride route, with Therminol 66, (mixed hydrogenated terphenyls) being employed as the high boiling solvent for the reactants and for the reaction product. The weights of reactants are 138 grams of p-hydroxybenzoic acid, 166 grams of terephthalic acid and 230 grams of 4,4'-thiodiphenol. Also employed are 357 grams of acetic anhydride and 500 grams of Therminol 66. The temperature of the reaction mix is rapidly raised to 330° C. and held there for three hours. It is noted that the reactants and the polymer produced are completely soluble in the Therminol 66 at such temperature and on cooling precipitation is not evident until the temperature is lowered to 255° C. The solubility characteristics of the polymer are particularly surprising in view of the fact that the monomers from which it was made are all para substituted aromatics and such monomers are not known to produce soluble polymers.

The polymer is precipitated by lowering the temperature of the Therminol 66 to room temperature (about 25° C.) and the precipitated polymer is removed, after which it is extracted with boiling acetone, to remove the Therminol 66, and is dried. The polymer is advanced in air at 250° C. in a rotary oven for a period of two hours and is then extruded at 249° C. and the powdered product resulting is injection molded into tensile bar form in an injection molding apparatus having a barrel temperature of 343° C. The bars obtained are tested and are found to possess excellent "snapback" characteristics. They can be twisted repeatedly but still return to their initial form when twisting forces are released. Corresponding polymers based on 4,4'-dihydroxybiphenol instead of the thiodiphenol exhibit poor "snapback" and such polymers based on 4,4'-dihydroxydiphenyl sulfone instead of the thiodiphenol are of insufficient thermal stability to be moldable. Similar results are obtained when in place of the 4,4'-thiodiphenol the 3,4'- and 3,3'-isomers are substituted and/or when isophthalic acid replaces terephthalic acid in the manufacture of the present copolyesters.

EXAMPLE 2

The resin previously described in Example 1, after extraction with boiling acetone and drying, but without nitrogen advancement, is jet milled to reduce the particle sizes thereof. A 26% solids content dispersion of this resin is made in water, with about 0.8% of Triton ® DF-12 (a biodegradable modified polyethoxylated straight chain alcohol) being present. The resin dispersion is passed through a colloid mill to break up any agglomerates and 58 grams of the dispersion are admixed with 100 grams of a polytetrafluoroethylene-water dispersion (60% solids), marketed by E. I. DuPont De Nemours and Co. as T30. The resultant copolyester:polytetrafluoroethylene ratio is 20:80.

An aluminum article, the surface of which has been grit blasted and primed with a primer for polytetrafluoroethylene (DuPont 850-202 primer), is spray coated with the mentioned water dispersion of the copolyester and polytetrafluoroethylene. The coating is dried five minutes at 100° C. and is then sintered for 15 minutes at 399° C. The fused coating resulting is tested for scratch resistance with a DuPont scratch tester and a scratch resistance of 1.5 kg./sq. cm. is obtained. This is a very high measure of toughness and scratch resistance and was unexpected because scratch resistances of about 0.8 kg./sq. cm. and 0.7 kg./sq. cm. are obtained for coatings obtained from the polytetrafluoroethylene polymer alone and for a polymer which is a mixture of 60 parts of such polytetrafluoroethylene and 40 parts of a copolyester similar to that of the invention except for the replacement of p,p-thiodiphenoxy with p,p-diphenoxy moieties.

EXAMPLE 3

A copolyester of this invention is prepared by reaction of one molar proportion of p-hydroxybenzoic acid, two molar proportions of isophthalic acid and two molar proportions of 4,4'-thiodiphenol. The weights of reactants employed are 138 grams, 332 grams and 460 grams, respectively. The polymerization is carried out via the acetic anhydride route by melting a mixture of the given weights of the reactants mentioned with 500 grams of acetic anhydride. In carrying out this reaction the temperature is rapidly increased to 360° C. and is held there for one hour, after which the melt is cooled to room temperature and the resin resulting is pulverized in a hammer mill. A 20% solution of this resin in o-cresol is prepared and is found to be unexpectedly and desirably stable, lasting for several weeks before clouding. Solutions of copolyester resins in o-cresol and other organic solvents, wherein hydroquinone is utilized instead of the 4,4'-thiodiphenol, will usually become cloudy immediately after the making of such a solution is attempted or at best, within one week thereafter and those wherein 4,4'-dihydroxybiphenyl is used instead of the thiodiphenol never are clear solutions.

The solution of the invented copolyester described is used to coat magnet wire with a one mil coating, obtained by six dip passes of the wire and drying in an oven at a temperature of 360° C. After cooling of the wire it is viewed with a microscope and no pin holes or cracks in the coating are observable. The flexibility of the coating is measured by wrapping the wire around a mandrel of the same diameter as the wire and even after such treatment no pin holes or cracks are observable when the coating again is viewed with a microscope. Similar results are obtained when, as in Example 1, isophthalic acid and the other thiodiphenol isomers are utilized to make the copolyester, when the proportions of reactants are varied within the given ranges, e.g., ±10, 20 and 30% for x, y and z, with the y:z ratio being changed only 5%, and when other organic solvents are utilized to make the described solutions.

The invention has been described with respect to various illustrative examples thereof but is not to be limited to these because it is evident that one of skill in the art with the present specification before him will be able to utilize substitutes and equivalents without departing from the invention.

What is claimed is:

1. A p-oxybenzoyl copolyester having a molecular weight in the range of 500 to 72,000, which is flexible and soluble in organic solvents and which comprises recurring moieties of the following formulas:

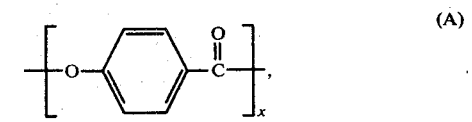

(A)

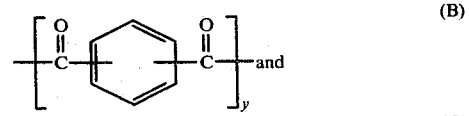

(B)

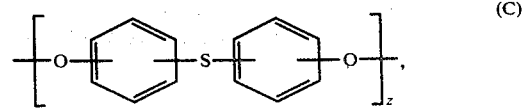

(C)

wherein y:z equals 0.1 to 10; x:z equals 0.1 to 10; x:y equals 0.9 to 1.1; x+y+z equals 20 to 600; the carbonyl groups of (B) are meta or para to each other; and the oxygen atoms of (C) are meta or para to the sulfur atom thereof.

2. A polyester according to claim 1 wherein the carbonyl groups of (B) are para to each other.

3. A polyester according to claim 1 wherein the oxygen atoms of (C) are para to the sulfur atoms thereof.

4. A polyester according to claim 2 wherein the oxygen atoms of (C) are para to the sulfur atoms thereof.

5. A polyester according to claim 1 wherein x:y is in the range of 0.4 to 1.5.

6. A polyester according to claim 1 wherein y:z is in the range of 0.95 to 1.05.

7. A polyester according to claim 1 wherein x+y+z is in the range of 20 to 200 and which polyester has a molecular weight in the range of 3,000 to 30,000.

8. A polyester according to claim 3 wherein the carbonyl groups of (B) are meta to each other.

9. A polyester according to claim 3 wherein x:y and x:z are in the range of 0.4 to 1.5, y:z is in the range of 0.95 to 1.05, x+y+z is in the range of 20 to 200 and which is of a molecular weight in the range of 3,000 to 30,000.

10. A polyester according to claim 9 wherein the carbonyl groups (B) are para to each other.

11. A polyester according to claim 10 wherein x:y and x:z are about 1, y:z is about 1, and which is of a molecular weight in the range of 3,500 to 25,000.

12. A polyester according to claim 9 wherein the carbonyl groups of (B) are meta to each other.

13. A polyester according to claim 12 wherein x:y and x:z are about 0.5, y:z is about 1; and which is of a molecular weight in the range of 3,500 to 25,000.

14. A flexible molded p-oxybenzoyl copolyester polymer of claim 1.

15. A molded polymer according to claim 14 wherein the copolyester is that of claim 11.

16. A scratch resistant polymeric coating on a substrate which comprises a p-oxybenzoyl copolyester of claim 1 and a polytetrafluoroethylene polymer in a proportion within the range of 1:10 to 1:1.

17. A coating according to claim 16 wherein the copolyester polymer is that of claim 11 and the proportion of copolyester to polytetrafluoroethylene is within the range of 1:7 to 1:3.

18. A flexible coating on a substrate which comprises a p-oxybenzoyl copolyester of claim 1.

19. A flexible coating according to claim 18 wherein the copolyester is that of claim 13.

20. A solution of a p-oxybenzoyl copolyester in an organic solvent wherein the copolyester is that of claim 1.

21. A solution according to claim 20 wherein the copolyester is that of claim 11.

22. A solution according to claim 20 wherein the copolyester is that of claim 13.

23. A polyester according to claim 1 wherein x:y equals 0.2 to 2 and x:z equals 0.2 to 2.

24. A polyester according to claims 23 wherein the carbonyl groups of (B) are para to each other and the oxygen atoms of (C) are para to the sulfur atom thereof.

* * * * *